United States Patent [19]
Satou et al.

[11] Patent Number: 5,801,999
[45] Date of Patent: Sep. 1, 1998

[54] SEMICONDUCTOR MEMORY

[75] Inventors: Kenji Satou; Yuichi Matsushita, both of Miyazaki, Japan

[73] Assignee: Oki Electric Industry Co., Ltd., Tokyo, Japan

[21] Appl. No.: 769,158

[22] Filed: Dec. 18, 1996

[30] Foreign Application Priority Data

Feb. 23, 1996 [JP] Japan .................. 8-036189

[51] Int. Cl.$^6$ .................................................. G11C 7/00
[52] U.S. Cl. ........................... 365/200; 365/230.06
[58] Field of Search ............... 365/200, 230.06, 365/230.03, 96

[56] References Cited

U.S. PATENT DOCUMENTS 5,323,348  6/1994  Mori et al. ...................... 365/200
5,394,368  2/1995  Miyamoto ....................... 365/230.06
5,572,482  11/1996  Hoshizaki ....................... 365/230.06

FOREIGN PATENT DOCUMENTS 401957  12/1990  European Pat. Off. .

*Primary Examiner*—A. Zarabian
*Attorney, Agent, or Firm*—Spencer & Frank

[57] ABSTRACT

A redundant semiconductor memory capable of functioning normally on the whole even if two column (or row) lines do not function normally. The semiconductor memory includes primary and secondary selection circuits, primary and secondary switchover circuits, and (N+2) memory cell groups. The primary switchover circuit receives a decoded address signal of N bits for selecting one memory sell group, and outputs to the secondary switchover circuit a signal of (N+1) bits which is generated by inserting a bit into a position of the inputted decoded address signal specified by the primary selection circuit. The secondary switchover circuit outputs to the memory cell groups a signal of (N+2) bits which is generated by inserting a bit into a position of the inputted signal specified by the secondary selection circuit.

8 Claims, 13 Drawing Sheets

FIG. 5(a) BSEL

FIG. 5(b) INPUT TO INVERTERS $21_1$-$21_N$

FIG. 5(c) INPUT TO INVERTERS $31_1$-$31_N$

FIG. 5(d) OUTPUT FROM NAND GATE $11_1$

FIG. 5(e) OUTPUT FROM NAND GATES $11_i$ (i≠1)

FIG. 5(f) OUTPUT FROM INVERTER $42_1$

FIG. 5(g) OUTPUT FROM INVERTERS $42_i$ (i≠1)

FIG. 7(a) BSEL 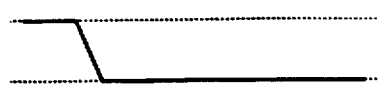
FIG. 7(b) INPUT TO INVERTER $21_N$ 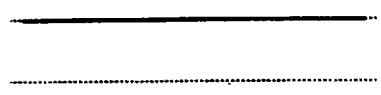
FIG. 7(c) INPUT TO INVERTERS $21_i$ ($i \neq N$) AND INVERTERS $31_1$-$31_{N+1}$ 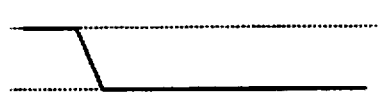
FIG. 7(d) OUTPUT FROM NAND GATES $11_N$ 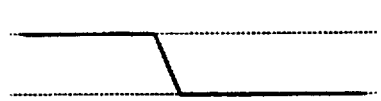
FIG. 7(e) OUTPUT FROM INVERTER $42_{N+1}$ 
FIG. 7(f) OUTPUT FROM INVERTERS $42_i$ ($i \neq N+1$) 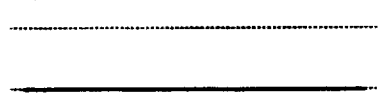

FIG. 9(a) BSEL

FIG. 9(b) INPUT TO INVERTERS $21_i$ (i>=N-1) AND INVERTERS $31_j$ (j>=N)

FIG. 9(c) INPUT TO INVERTERS $21_i$ (i<N-1) AND INVERTERS $31_j$ (j<N)

FIG. 9(d) OUTPUT FROM NAND GATES $11_N$

FIG. 9(e) OUTPUT FROM INVERTER $42_{N+2}$

FIG. 9(f) OUTPUT FROM INVERTERS $42_i$ (i≠N+2)

SEMICONDUCTOR MEMORY

BACKGROUND OF THE INVENTION

1. Field of the Invention

The present invention relates to a semiconductor memory including a redundant circuit for saving a defective cell or the like.

2. Description of the Related Art

Some semiconductor memories such as DRAMs (Dynamic Random Access Memories) include a circuit (hereinafter termed a redundant circuit) for changing a corresponding relationship between a preparatory memory cell, an address and a memory cell so that the memory is capable of operating as a memory device even if some of the memory cells do not normally function.

Circuits known as redundant circuits used in the above-described semiconductor memory may employ ATD (Address Transition Detector) or use a circuit called a shift redundant circuit. The redundant circuit using ATD is complicated in terms of circuit construction and takes much time till column lines are activated. Hence, semiconductor memories using the shift redundant circuits have become increasingly popular, and can be actualized with simple circuit constructions and are fast in activating the column lines.

Hereinafter, the configuration and operation of the prior art shift redundant circuit will be outlined with reference to FIG. 13.

As depicted in the Figure, the redundant circuit is mainly constructed of a Y-address decoder 10, a selection circuit 15, a column line switchover circuit 20, a column driver 40.

The Y-address decoder 10 includes M input terminals (unillustrated) to which the column address AY is inputted, and N ($=2^M$) NAND gates $11_1$–$11_N$. Provided between the input terminals and the respective NAND gates 11 are a multiplicity of logic gates (not shown) for making one NAND gate 11, corresponding to AY, output a signal of the "L" level.

The selection circuit 15 is constructed of fuses $16_1$–$16_N$ a latch circuit 17. The fuses $16_1$–$16_N$ are connected in series, and the latch circuit 17 is connected to the fuse $16_N$. BSEL, a signal the level of which is varied from "H" to "L" when the semiconductor memory is accessed, is inputted to the fuse $16_1$. BSEL is also inputted to the latch circuit 17. The latch circuit 17 is constructed so as to output a signal, the level of which is varied corresponding to BSEL, toward the fuse $16_N$ when no fuse 16 is disconnected, and to output "H" level signal when a fuse 16 is disconnected.

The column line switchover circuit 20 is constructed of inverters $21_1$–$21_N$, inverter $22_1$–$22_N$, NMOS transistors (occasionally called NMOSes hereafter) $23_1$–$23_N$, NMOSes $24_1$–$24_N$, PMOS transistors (occasionally called PMOSes hereafter) $25_1$–$25_{N-1}$, and PMOSes $26_1$–$26_{N+1}$. An input terminal of the inverter $21_K$ (K=1 to N−1) is connected to a connecting portion between the fuse $16_K$ and the fuse $16_{K+1}$ in the selection circuit 15. Further, an input terminal of the inverter $21_N$ is connected to a connecting portion between the fuse $16_{N+1}$ and the circuit 17.

The output terminal of the inverter $21_K$ (K=1 to N) is connected to the gate of PMOS $23_K$, the gate of PMOS $26_K$ and the input terminal of the inverter $22_K$. The output terminal of the inverter $22_K$ is connected to the gate of PMOS $24_K$ and the gate of PMOS $25_{K+1}$. The source of NMOS $23_K$ (K=1 to N) is connected to the source of NMOS $24_K$. A signal from NAND gate $11_K$ in the address decoder 10 is inputted to a connecting portion therebetween.

The source of PMOS $25_K$ (K=1 to N+1) is connected to the power supply line (indicated by an arrowhead in the Figure). The drain of PMOS $26_1$ is connected to the drain of NMOS $23_1$, and the drain of PMOS $26_K$ (K=2 to N) is connected to the drain of NMOS $23_K$ and to the drain of NMOS $24_{K-1}$. Further, the drain of PMOS $26_{N+1}$ is connected to a drain of NMOS $24_N$. Then, "N+1" signals are obtained from connecting portions relating to the sources of NMOS transistors $26_1$–$26_N$ and are fed to the column driver 40.

The column driver 40 is constructed of "N+1" circuits each of which consists of a PMOS transistor (occasionally called simply a PMOS) 41 and an inverter 42. The source of PMOS $41_K$ (K=1 to N+1) is connected to the power supply line. The drain and the gate of PMOS $41_K$ are connected respectively to the input terminal and output terminal of the inverter $42_K$ and the output of the inverter $42_K$ is supplied to a column selection switch $SW_K$ for controlling a column line $CL_K$.

That is, when this semiconductor memory is accessed, the selection circuit 15 outputs "N" "L" or "H" level signals in accordance with the condition of the fuses 16. For example, when the fuse $16_p$ is disconnected, the selection circuit 15 feeds "P−1" individual "L" level signals to the inverters $21_1$–$21_{p-1}$ and "N−p+1" individual "H" level signals to the inverters $21_p$–$21_N$.

As a result, NMOSes $23_1$–$23_{p-1}$, to the gates of which "H" level signals are inputted, are turned ON. Turned OFF, further, are NMOSes $24_1$–$24_{p-1}$, to the gates of which the signals ("L" level signals) are inputted from the inverter $22_1$–$22_{p-1}$. Besides, NMOSes 23p–$23_N$, to the gates of which the "L" level signals are inputted, are turned OFF and NMOSes 24p–$24_N$, to the gates of which "H" level signals are inputted, are turned ON.

Accordingly, the signals from the NAND gates $11_1$–$11_{P-1}$ in the Y-address decoder 10 are supplied to the inverters $42_1$–$42_{p-1}$ in the column decoder 40 via NMOSes $23_1$–$23_{p-1}$ respectively. Moreover, the signals from the NAND gates $11_p$–$11_N$ are supplied to the inverters $42_{p+1}$–$42_{N+1}$ in the column decoder 40 via NMOS $24_p$–$24_N$ respectively.

In all, when a fuse $16_p$ is disconnected, the signals from the NAND gates $11_1$–$11_{P-1}$ are supplied respectively to the column selection switches $SW_1$–$SW_{p-1}$ for the column lines $CL_1$–$CL_{p-1}$, and the signals from the NAND gates $11_p$–$11_N$ are supplied respectively to the column selection switches $SW_{p+1}$–$SW_{N+1}$ for the column lines $CL_{p+1}$ –$CL_N$ and the redundant column line RCL. That is, the semiconductor memory functions without activating the memory cells connected to the column line $CL_p$.

Thus, the semiconductor memory has a construction which enables it to function normally even if there are defective memory cells. There arises, however, a problem inherent in the redundant circuit having the construction described above, wherein only one column line provided in the semiconductor memory can be saved.

SUMMARY OF THE INVENTION

Accordingly, it is an object of the present invention to provide a semiconductor memory capable of operating normally even when two column (or row) lines do not normally function.

To accomplish the above object, according to the present invention, a semiconductor memory is constructed of (N+2) memory cell groups, an address decoder, a primary selection signal outputting circuit, a secondary selection signal outputting circuit, a first switchover circuit and a second switchover circuit. (N+2) memory cell groups are connected first through (N+2)th control signal lines, respectively. The memory cell groups are turned ON when first potential level signals are supplied to the first through (N+2)th control signal lines. The address decoder outputs first through Nth control signals, one of which assumes the first potential level and the rest of which assume a second potential level, on the basis of inputted address signals.

The primary selection signal outputting circuit outputs first signal level signals as first through Pth primary selection signals, and outputs second signal level signals as (P+1)th through Nth primary selection signals. The primary selection signal outputting circuit is so constructed as to be capable of setting a value of P. The secondary selection signal outputting circuit, capable of setting a value of Q, outputs the first signal level signals as first through Qth secondary selection signals, and outputs the second signal level signals as (Q+1)th through (N+1)th secondary selection signals.

The first switchover circuit has first through (N+1)th primary control signal output nodes and first through Nth primary control signal input nodes to which the first through Nth control signals are inputted from the address decoder. The first switchover circuit electrically connects the first through Pth primary control signal input nodes respectively to said first through Pth primary control signal output nodes in accordance with the first through Nth primary selection signals from the primary selection signal outputting circuit. Besides, the first switchover circuit electrically connects the (P+1)th through Nth primary control signal nodes respectively to the (P+2)th through (N+1)th primary control signal output nodes. Furthermore, the first switchover circuit outputs the second potential level signals to the (P+1)th primary control signal output nodes.

The secondary switchover circuit has first through (N+2)th secondary control signal output nodes connected to the first through (N+2)th control signal lines and first through (N+1)th secondary control signal input nodes connected to the first through (N+1)th primary control signal output nodes of the primary switchover circuit. The secondary switchover circuit electrically connects the first through Qth secondary control signal input nodes respectively to the first through Qth control signal output nodes, and electrically connects the (Q+1)th through (N+1)th secondary control signal input nodes respectively to the (Q+2)th through (N+2)th secondary control signal output nodes, and outputs the second potential level signal to the (Q+1)th secondary control signal output node in accordance with the first through (N+1)th secondary selection signals given from the secondary selection signal outputting circuit.

According to the thus constructed semiconductor memory, a combination of N memory cell groups which are accessed is able to be changed by setting P and Q. Therefore the semiconductor memory is capable of operating normally even when two memory cell groups (two column or row lines) do not normally function.

Actualization of the semiconductor memory according to the present invention involves the use of the primary switchover circuits which includes first through Nth normality NMOSes and first through Nth redundancy NMOSes, and the secondary switchover circuits which includes first through (N+1)th normality NMOSes and first through (N+1) th redundancy NMOSes.

A Kth (K=1 to N) normality NMOS in the primary switchover circuit electrically connects the Kth primary control signal input node to the Kth primary control signal output node when the Kth primary selection signal assumes the first signal level. A Kth redundancy NMOS in the primary switchover circuit electrically connects the Kth primary control signal input node to the (K+1)th primary control signal output node when the Kth primary selection signal assumes the second signal level.

A Kth (K=1 to N+1) normality NMOS in the secondary switchover circuit electrically connects the Kth secondary control signal input node to the Kth secondary control signal output node when the Kth secondary selection signal assumes the first signal level. A Kth redundancy NMOS in the secondary switchover circuit electrically connects the Kth secondary control signal input node to the (K+1)th secondary control signal output node when the Kth secondary selection signal assumes the second signal level.

Moreover' a circuit including a primary fuse circuit and a latch circuit may be adopted as the primary selection signal outputting circuit. The primary fuse circuit is constructed of first through Nth primary fuses connected in series, to which a selection signal generating signal the level of which changes in terms of time is inputted from the first primary fuse. The primary latch circuit, which is connected to said Nth primary fuse of the primary fuse circuit, outputs the second signal level signal to the Nth primary fuse when one of the first through Nth primary fuses is disconnected, and outputs a signal having the same level as the selection signal generating signal to said Nth primary fuse when the first through Nth primary fuses are not yet disconnected. Note that the first through Nth primary selection signals are fetched out of terminals, on the side of the primary latch circuit, of the first through Nth primary fuses.

Furthermore, a circuit including a secondary fuse circuit and a secondary latch circuit may be used as the secondary selection signal outputting circuit.

The secondary fuse circuit is constructed of first through Nth secondary fuses connected in series, to which the selection signal generating signal is inputted from the first fuse.

The secondary latch circuit, which is connected to said (N+1)th secondary fuse of the secondary fuse circuit, outputs the second signal level signal to the (N+1)th primary fuse when one of the first through (N+1)th secondary fuses is disconnected, and outputs a signal having the same level as the selection signal generating signal to the (N+1)th secondary fuse when the first through (N+1)th secondary fuses are not yet connected. The first through (N+1)th secondary selection signals are fetched out of terminals, on the side of the secondary latch circuit, of the first through (N+1)th secondary fuses.

When constructing the primarily switchover circuit with using NMOSes, first through Nth normality PMOSes and first through Nth redundant PMOSes may be added to the primarily switchover circuit.

The Kth (K=1 to N) normality PMOS, having a drain and a gate that are connected to the drain and the source of the Kth normality NMOS, is brought into ON-status when the Kth primary selection signal with the first signal level is fed. The Kth redundancy PMOS, having a drain and a gate that are connected to the drain and the gate of the Kth normality NMOS, is brought into ON-status when the Kth primary selection signal with the second signal level is fed.

Furthermore, first through (N+1)th normality PMOSes and first through (N+1)th redundant PMOSes may be added to the secondary switchover circuit.

The Kth (K=1 to N+1) normality PMOS, having a drain and gate that are connected to the drain and the source of the Kth normality NMOS, is brought into ON-status when the Kth secondary selection signal with the first signal level is fed. The Kth redundancy PMOS, having a drain and a source that are connected to the drain and the source of the Kth normality NMOS, is brought into ON-status when the Kth primary selection signal with the second signal level is fed.

When constructing the first and/or secondary switchover circuit by adding PMOSes, a semiconductor memory which operates with a high speed is actualized.

BRIEF DESCRIPTION OF THE DRAWINGS

Other objects and advantages of the present invention will become apparent during the following discussion in conjunction with the accompanying drawings, in which:

FIGS. 7(a)–7(f) form a timing chart of assistance in explaining the operation of the redundant circuit when one fuse is disconnected;

DETAILED DESCRIPTION OF THE PREFERRED EMBODIMENTS

Embodiments of the present invention will hereinafter be discussed with reference to the accompanying drawings.

First Embodiment

To begin with, an outline of a semiconductor memory in accordance with a first embodiment will be explained.

The semiconductor memory in the first embodiment has 4(N+2)×L memory cells arranged in a matrix consisting of L-rows and 4(N+2)-columns. The 4(N+2) memory cells corresponding to the respective rows are individually connected to a row line (word line). The row line is connected to a circuit constructed of a row driver and a row decoder. Inputted to this circuit is a row address AX defined as a part of an address to the semiconductor memory. Then, this circuit activates the memory cells connected to that row line by outputting a signal assuming a predetermined level. Note that the row lines (memory cells) are, though a specific explanation is omitted herein, classified into a plurality of groups, and one block is formed by the memory cells connected to the row lines belonging to the individual groups.

The memory cells in each block are respectively connected to the column lines (data lines). The 4(N+2) column lines are each connected to an I/O line via a column selection switch. Among the memory cells connected to the activated row line, a memory cell connected to the column line having a column selection switch controlled in an ON-status is electrically connected to the I/O line.

Figure 1A:
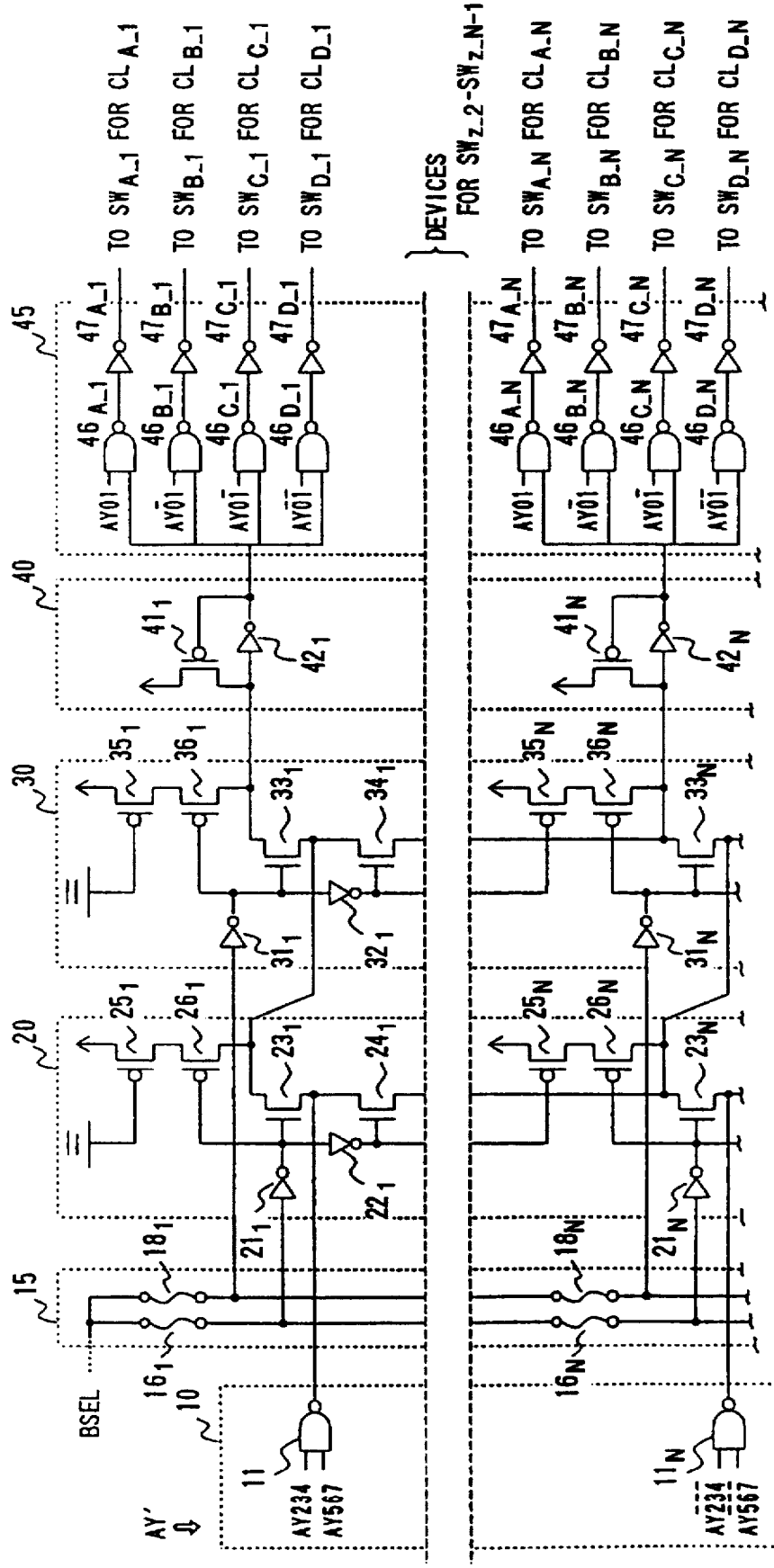
FIG. 1 is a circuit diagram showing a redundant circuit provided in a semiconductor memory in a first embodiment.
Figure 1B:
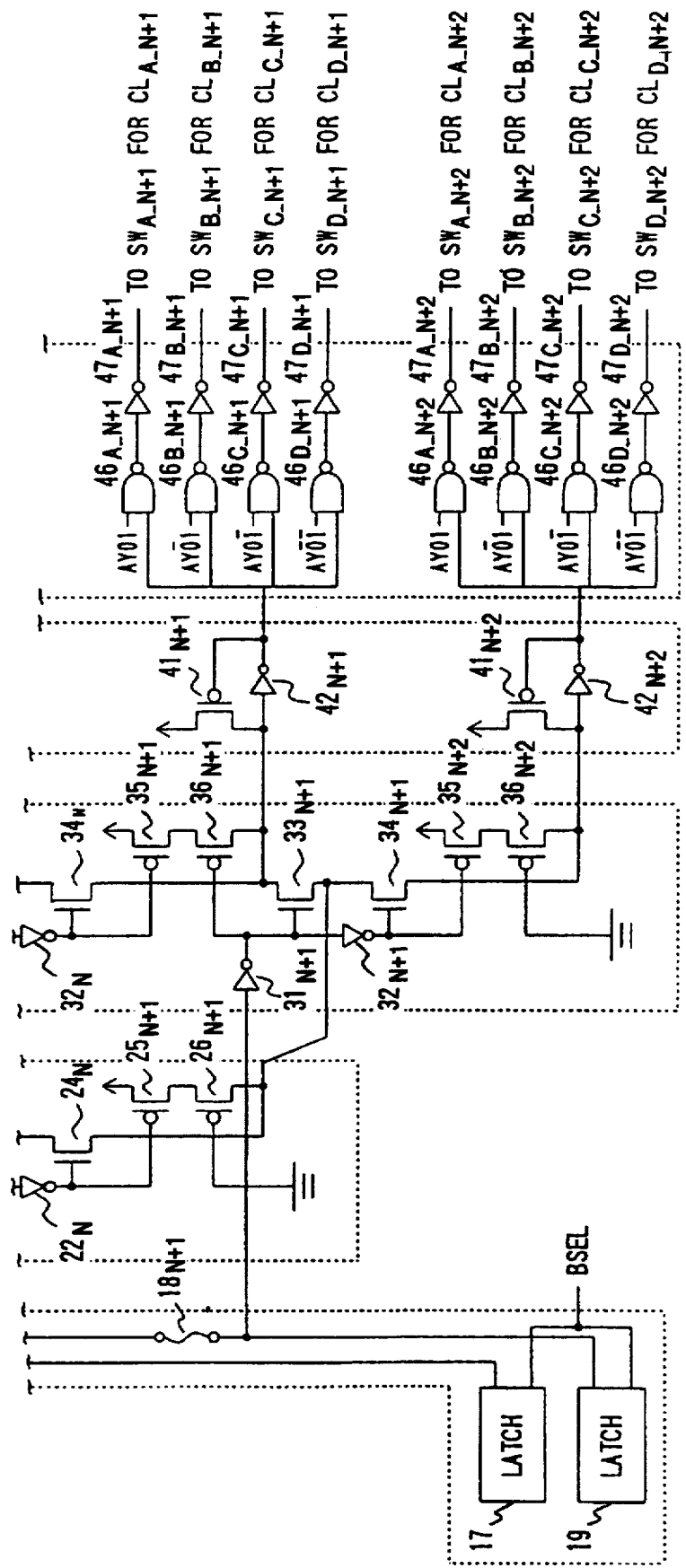

According to the semiconductor memory in this embodiment, 8(=4×2) column lines among the 4(N+2) column lines are used, if one (or two) of the remaining column lines does not operate normally, for saving this column line. Then, the present semiconductor memory is provided with a redundant circuit, illustrated in FIG. 1, for executing the above saving treatment by effecting ON-OFF control of the column selection switches.

As depicted in the Figure, the redundant circuit is mainly constructed of a Y-address decoder 10, a selection circuit 15, a first column line switchover circuit 20, a second column line switchover circuit 30, a column driver 40 and a column group selection circuit 45.

The Y-address decoder 10 includes M input terminals (unillustrated) to which some bits (designated by AY' in the Figure) of the column address AY are inputted, and N (=$2^M$) of NAND gates $11_1$–$11_N$. Specifically, the Y-address decoder 10 has 6 input terminals to which the second through seventh bits of the column address AY are inputted, and 64 of NAND gates 11.

Provided between the input terminals and the respective NAND gates 11 are a multiplicity of logic gates (not shown) for outputting signals each taking the "L" ("0") level from only the NAND gates corresponding to contents of the 6-bit AY' address group inputted from the 6 input terminals. Provided between, for example, the NAND gate $11_1$ and the input terminals are the logic gates for generating the AND (AY234) of values of the second through fourth bits of the column address AY, and the AND (AY567) of values of the fifth through seventh bits. Therefore, the NAND gate $11_1$ outputs "0" only when all the values of the second through seventh bits of the column address AY are "1", and outputs "1" (the signal assuming the "H" level) in other cases. Provided further between the NAND gate $11_N$ and the input terminals are the logic gates for generating the AND (AY 234) of inverted values of the second through fourth bits of AY, and the AND (AY567) of inverted values of the fifth through seventh bits. Hence, the NAND gate $11_N$ outputs "0" only when all the values of the second through seventh bits of the column address AY are "0", and outputs "1" in other cases.

Thus, the Y-address decoder 10 is constructed so that when AY (AY') is inputted, one NAND gate 11, corresponding to AY', among the NAND gates $11_1$–$11_N$ outputs the signal of the "L" level, while the NAND gates 11 other than the above-mentioned one output signals of the "H" level.

The selection circuit 15 is constructed of fuses $16_1$–$16_N$, fuses $18_1$–$18_{N+1}$, a latch circuit 17 and a latch circuit 19. As illustrated in the Figure, the fuses $16_1$–$16_N$ are connected in series, and the latch circuit 17 is connected to the fuse $16_N$. The fuses $18_1$–$18_{N+1}$ are also connected in series, and the latch circuit 19 is connected to the fuse $18_{N+1}$. Then, block selection signals (BSEL) are inputted to the fuses $16_1$ and $18_1$ and the latch circuits 17 and 19.

Figure 2:
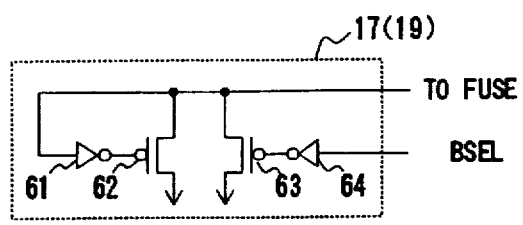
FIG. 2 is a circuit diagram illustrating a latch circuit provided in the redundant circuit in the first embodiment.

FIG. 2 illustrates a configuration of the latch circuit 17 (19). As shown in FIG. 2, the latch circuit 17 (19) is constructed of inverters 61, 64 and a PMOS (P channel metal-oxide semiconductor transistor) 62 and a PMOS 63. The drain of the PMOS 63 is connected to the drain of the PMOS 62 and to the input terminal of the inverter 61. The output terminal of the inverter 61 is connected to the gate of the PMOS 62. The output of the inverter 64, to which BSEL is inputted, is connected to the gate of the PMOS 63. The sources of the PMOS 62 and of the PMOS 63 are connected to a power supply line (indicated by an arrowhead in the Figure). Then, the drains of the PMOS 62 and of the PMOS 63 and the input terminal of the inverter 61 are connected to the fuse $16_N$ (or the fuse $18_{N+1}$).

Herein, an outline of BSEL is described with reference to FIG. 3. As has already been explained, in the semiconductor memory in the embodiment, the memory cells (row lines) are divided into a plurality of blocks. BSEL is a signal for selecting one block corresponding to a row address AX, and is, as shown in the Figure, generated based on a row address strobe RAS and the row address AX. Note that the signal BSEL is, when selected, a signal taking the "L" (0) level, and AY is, after BSEL has assumed the "L" level, inputted to the Y-address decoder 10.

Referring back to FIG. 1, the explanation of the construction of the redundant circuit will continue.

The first column line switchover circuit 20 is constructed of inverters $21_1$–$21_N$, inverters $22_1$–$22_N$, NMOSes $23_1$–$23_N$, NMOSes $24_1$–$24_N$, PMOSes $25_1$–$25_{N+1}$, and PMOSes $26_1$–$26_{N+1}$.

The input terminal of the inverter $21_K$ (K=1 to N−1) is connected to a connecting portion between the fuse 16K and the fuse $16_{K+1}$ in the selection circuit 15. Further, the input terminal of the inverter $21_N$ is connected to a connecting portion between the fuse $16_{N+1}$ and the latch circuit 17.

The output terminal of the inverter $21_K$ (K=1 to N) is connected to the gate of PMOS $23_K$, the gate of PMOS $26_K$ and the input terminal of the inverter $22_K$. The output terminal of the inverter $22_K$ is connected to the gate of PMOS $25_{K+1}$. The source of NMOS $23_K$ (K=1 to N) is connected to the source of NMOS $24_K$. Then, signals from NAND gates $11_K$ in the address decoder 17 is inputted to connecting portions therebetween.

The source of PMOS $25_K$ (K=1 to N+1) is connected to the power supply line (indicated by an arrowhead in the Figure), and the drain of PMOS $26_1$ is connected to the drain of NMOS $23_1$, and the drain of PMOS $26_K$ (K=2 to N) is connected to the drain of NMOS $23_K$ and to the drain of NMOS $24_{K-1}$. Further, the drain of PMOS $26_{N+1}$ is connected to the drain of NMOS $24_N$.

Then, signals to the second column line switchover circuit 30 are obtained from the connecting portions of the sources of those PMOSes $26_1$–$26_N$.

The second column line switchover circuit 30 has, as will be obvious from the Figure, substantially the same construction as that of the first column line switchover circuit 20. The second column line switchover circuit 30, however, includes (N+1) of inverters $31_1$–$31_{N+1}$ for receiving the signals from the selection circuit 15. Moreover, the sources of NMOSes 33 and of NMOSes 34 corresponding respectively to NMOSes 23 and NMOSes 24 are connected to not the Y-address decoder 10 but the first column line switchover circuit 20. Then "N+2" signals to the column driver 40 are obtained from the drains of NMOSes $36_1$–$36_{N+1}$ corresponding to NMOSes 26.

The column driver 40 is constructed of "N+2" circuits, each of which consists of a PMOS 41 and an inverter 42. The source of PMOS $41_K$ (K=1 to N+2) is connected to the power supply line, and the drain and the gate of PMOS $41_K$ are connected respectively to the input terminal and output terminal of the inverter $42_K$.

A signal from a connecting portion at the drain of PMOS $36_K$ (K=1 to N+2), within the second column switchover circuit 30, is inputted to the input terminal of the inverter $42_K$ connected to the drain of PMOS $41_K$, and the inverter $42_K$ outputs a signal opposite in level from the inputted signal.

The column group selection circuit 45 is chiefly constructed of NAND gates $46_{Z\_K}$ and inverters $47_{Z\_K}$ (Z=A to D, K=1 to N+2). The output terminal of the inverter $42_K$ (K=1 to N+2) within the column driver 40 is connected to one input terminal of each of four NAND gates $46_{Z\_K}$ (Z=A to D). Inputted respectively to the other input terminals of the NAND gates $46_{Z\_K}$ are AYO1, $\overline{AYO1}$, $AY\overline{O1}$, $\overline{AY}\overline{O1}$ generated based on the 0th and first bits of the column address AY. The output terminal of the NAND gates $46_{Z\_K}$ is connected to the input terminal of the inverter $47_{Z\_K}$, and the output of the inverter $47_{Z\_K}$ is supplied to the column selection switch $SW_{Z\_K}$ connected to a column line $CL_{Z\_K}$.

For instance, if the values of both the 0th bit and the first bit of the column address AY are "1" ("H" level), "0" is inputted to the NAND gates $46_{Z\_K}$ (Z≠A, K=1 to N+2) from one input terminal. Therefore, these NAND gates 46 output the signals of the "H" level invariably without depending on the signals from the column driver 40. As a result, the inverters $47_{Z\_K}$ (Z≠A, K=1 to N+2) output signals of the "L" level. Further, in this case, it follows that the "H" level signals from the column driver 40 are inputted to the NAND gates $46_{A\_K}$ (K=1 to N+2). Hence, the NAND gates $46_{A\_K}$ output inverted signals of the signals from the column driver 40, while the inverters $47_{A\_K}$ output the same level signal as the signals from the column driver 40.

Thus, the column group selection circuit 45 supplies "N+2" binary signals to "N+2" column selection switches SW belonging to the groups corresponding to contents of the 0th and first bits of the column address AY, and supplies the "L" level signals respectively to the remaining column selection switches belonging to the groups other than the above-mentioned.

A method of using the semiconductor memory (redundant circuit) and the operation thereof in the embodiment will hereinafter be described specifically. Explained at first with reference to FIGS. 4 and 5 is the operation in a status where the fuses are not disconnected, i.e., in the status where the column lines need not be saved and also the status of checking for determining whether or not the column lines should be saved.

Figure 3:
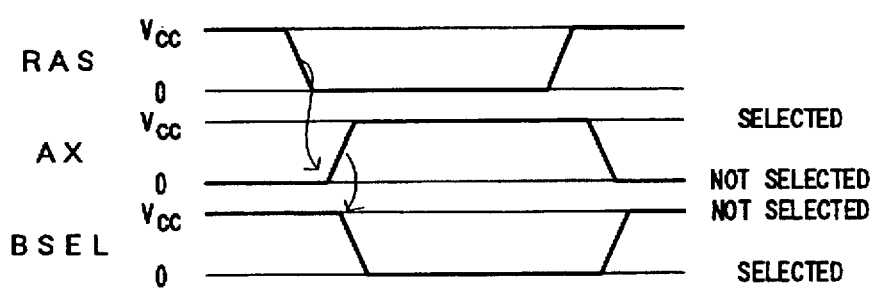
FIG. 3 is a timing chart of assistance in explaining BSEL.
Figure 4:
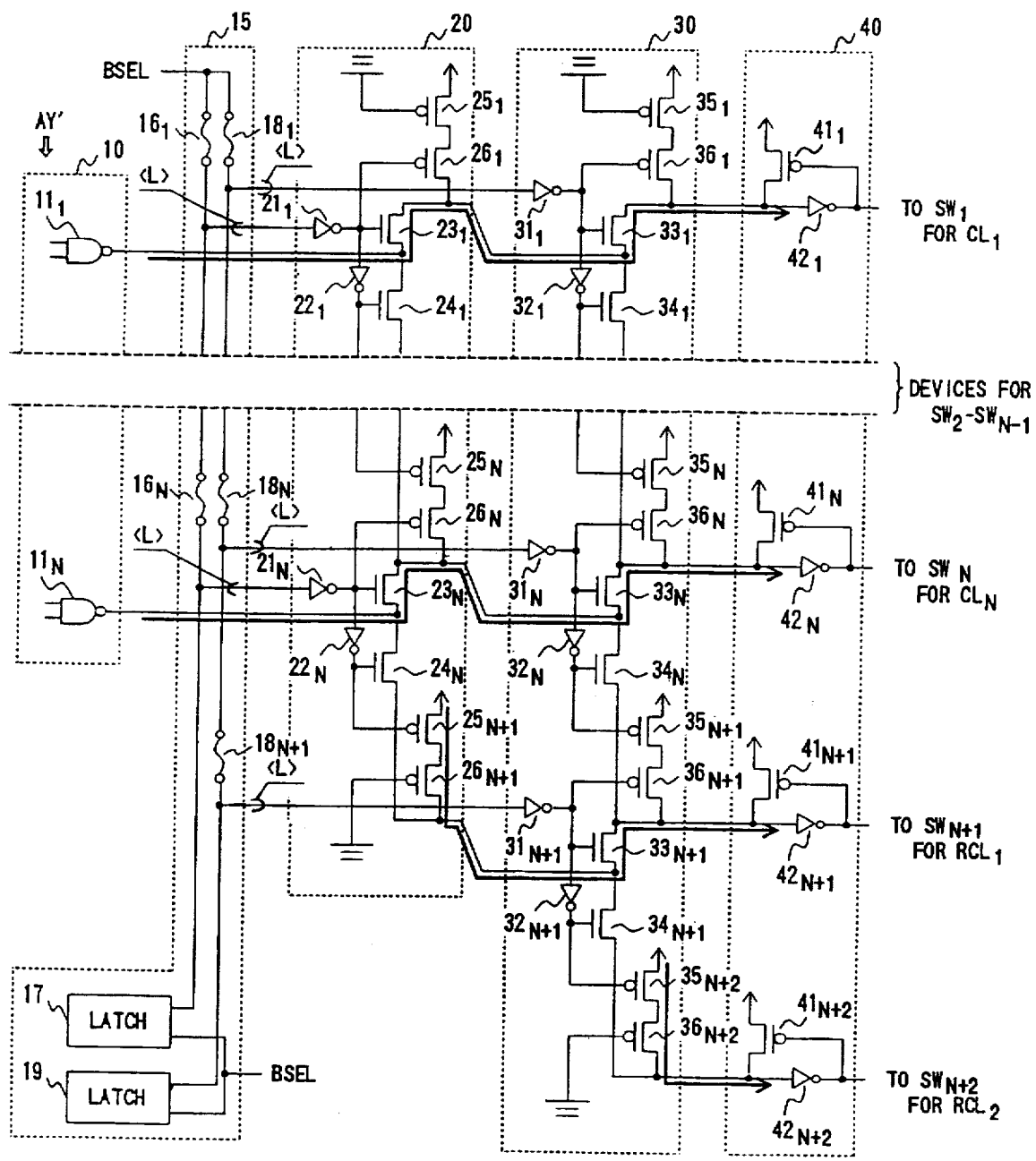
FIG. 4 is a circuit diagram of assistance in explaining the operation of the redundant circuit when fuse is not yet disconnected.
Figure 5:
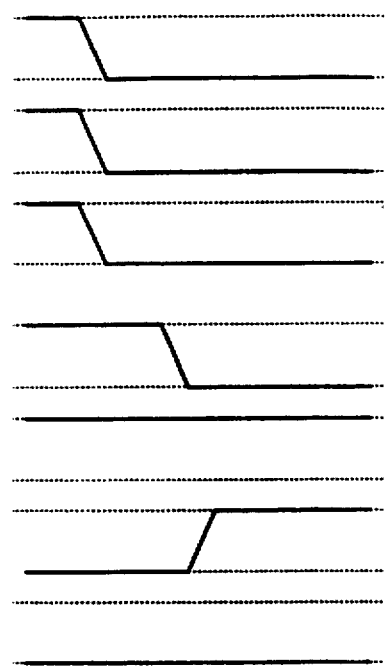
FIGS. 5(a)–5(g) form a timing chart of assistance in explaining the operation of the redundant circuit the fuse is not yet disconnected.

Incidentally, FIG. 4 is a diagram showing the circuit illustrated in FIG. 3 in addition to an illustration of signal paths. Referring to FIG. 4, however, the column lines $CL_{Z\_K}$ (K=1 to N+2) belonging to the column group selected by the column group selection circuit 45, are respectively designated by $CL_1$–$CL_N$, $RCL_1$, and $RCL_2$, and therefore the column group selection circuit is omitted. Further, FIG. 5 is a timing chart for assistance in explaining the operation when a fuse is not yet disconnected.

When control signals and an address are inputted to the semiconductor memory, as already explained, the BSEL level changes from the "H" level to the "L" level. Since the sources of PMOSes 62 in the latch circuits 17, 19 are connected to the BSEL output source via the fuses 16, 18 in this case, the "H" level signals latched by the latch circuits 17, 19 are cleared with the change of BSEL. Accordingly, the selection circuit 15 outputs totally "2N+1" signals, the levels of which change with a time in the same way as BSEL does, to the first and second column line switchover circuits 20, 30.

That is, as shown in FIGS. 5(a)–5(c), when BSEL assumes the "L" level in the status where no fuse is disconnected, the "L" level signals are inputted respectively to the inverters $21_1$–$21_N$ of the first column line switchover circuit 20 and to the inverters $31_1$–$31_{N+1}$ of the second column line switchover circuit 30. As a result, "H" level signals are inputted to the gates of NMOSes $23_1$–$23_N$, whereby NMOSes $23_1$–$23_N$ are turned ON. Turned OFF, further, are NMOSes $24_1$–$24_N$ to which the signals ("L" level signals) are inputted from the inverters $22_1$–$22_N$.

Accordingly, the signal from the NAND gate $11_K$ (K=1 to N) in the Y-address decoder 10 is supplied via NMOS $23_K$ to a connecting portion at the sources of NMOS $33_K$ and NMOS $34_K$ in the second column line switchover circuit 30. Then, NMOS $33_K$ and NMOS $34_K$ within the second column line switchover circuit 30 are, because of the inverter $31_K$ being supplied with the "L" level signal, respectively controlled in the ON/OFF statuses. Therefore, the signal supplied to the second column line switchover circuit 20 from the NAND gate $11_K$ (K-1 to N) is supplied via NMOS $33_K$ to the inverter $42_K$ in the column driver 40.

In all, when no fuse is disconnected, the signal from the NAND gate $11_K$ (K=1 to N) is, as indicated by bold lines in FIG. 4, inputted to the inverter $42_K$ in the column driver 40 via NMOS $23_K$ and NMOS $33_K$. Furthermore, as has already been explained, when AY' with a certain content is inputted, an "L" level signal is outputted from only one NAND gate 11 corresponding to AY'. Accordingly, the "L" level signal is supplied to only one inverter 42 among the inverters $42_1$–$42_N$, while other inverters 42 are supplied with "H" level signals.

For example, if the second through seventh bits of the column address AY are all "1", as indicated in FIGS. 5(d) and 5(e), an "L" level signal is outputted from only the NAND gates $11_1$ in the Y-address decoder 10. Hence, as shown in FIG. 5(f), an "H" level signal is outputted from the inverter $42_1$. "L" level signals are outputted from the inverters $42_2$–$42_N$ to which the corresponding NAND gates 11 output the "H" level signals.

Moreover, the gate of PMOS $26_{N+1}$ in the first column line switchover circuit 20 is grounded, and PMOS $25_{N+1}$ is controlled in the ON-status by the signals given from the selection circuit 15. Therefore, an "H" level signal is supplied to the connecting portion between the sources of NMOS $33_{N+1}$ and NMOS $34_{N+1}$ in the second column line switchover circuit 30. Subsequently, NMOS $33_{N+1}$ is also controlled in the ON-status by the signal from the selection circuit 15, and therefore it follows that the inverter $42_{N+1}$ is supplied with an "H" level signal. Similarly, both of PMOS $35_{N+2}$ and PMOS $36_{N+2}$ are in the ON-status, and hence an "H" level signal is supplied to the inverter $42_{N+2}$ from the drain of PMOS $36_{N+2}$.

In all, if the second through seventh bits of the column address AY are all "1", as indicated in FIG. 5(g), it follows that "L" level signals are outputted from all the inverters 42 excluding the inverter $42_1$. Subsequently, "N+2" signals from the inverters $42_1$–$42_{N+2}$ are supplied respectively to the column selection switches $SW_1$ to $SW_{N+2}$ connected to the column lines $CL_1$–$CL_N$, $RCL_1$ and $RCL_2$. As a result, only the memory cells corresponding to the column line $CL_1$ are electrically connected to the I/O line.

As discussed above, in the status where no fuse is disconnected, the column selection switches $SW_{N+1}$ and $SW_{N+2}$ connected to redundant column lines $RCL_1$ and $RCL_2$ are controlled in the OFF-status, and only the column selection switch connected to one of the column lines $CL_1$–$CL_N$ is controlled in the ON-status, corresponding to AY'.

Note that the gate of PMOS $25_1$ in the first column line switchover circuit 20 is grounded, and that the outputs of the inverters $22_1$–$22_{N-1}$ are inputted respectively to the gates of PMOS $25_2$–PMOS $25_N$. Therefore, when "L" level signals are inputted to the inverters $21_1$–$21_N$, all of PMOSes 25 are controlled in the ON-status. However, the outputs of the inverters $21_1$–$21_N$ are inputted to the gates of PMOS $26_1$–PMOS $26_N$ connected to PMOS $25_1$–PMOS $25_N$, and therefore PMOS $26_1$–PMOS $26_N$ are controlled in the OFF-status. For this reason, a module consisting of PMOS $25_K$ and PMOS $26_K$ (K=1 to N) exerts no influence upon the signals to the second column line switchover circuit 30.

Hereinafter, the operation of the redundant circuit in the status where a single fuse is disconnected will be explained with reference to FIGS. 6 and 7 by exemplifying a case where the column line $CL_N$ is abnormal.

Figure 6:
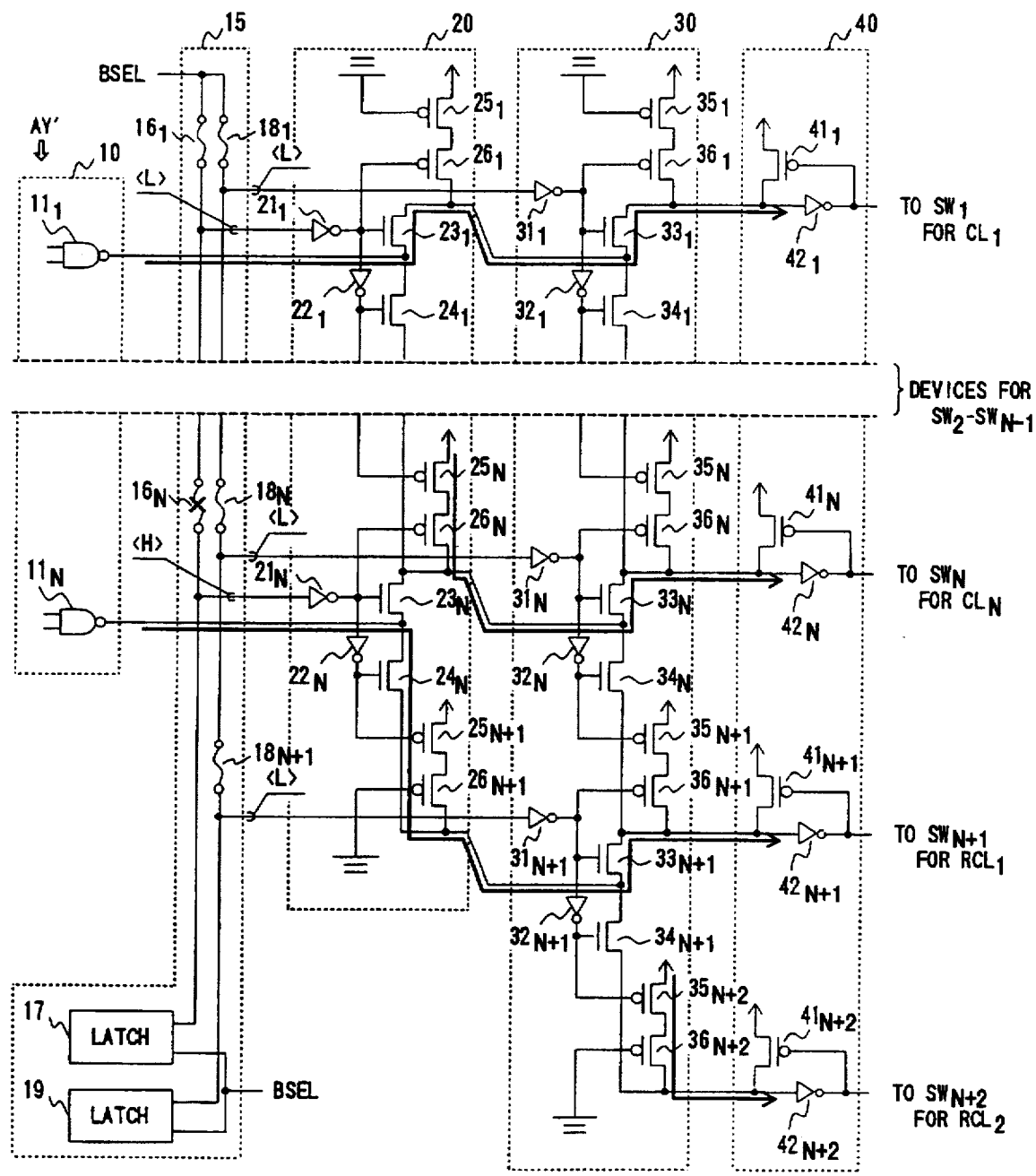
FIG. 6 is a circuit diagram of assistance in explaining the operation of the redundant circuit one fuse is disconnected.

In this case, as schematically illustrated in FIG. 6, the semiconductor memory is used after disconnecting the fuse $16_N$ corresponding to the column line $CL_N$.

When the signals for accessing a memory cell are inputted to the semiconductor memory in which the fuse $16_N$ is disconnected, the signals latched by the latch circuit 17 are not cleared even if BSEL changes from "H" to "L". Therefore, the latch circuit 17, even when BSEL is at the "L" level, continues to output the "H" level signals. On the other hand, the output of the latch circuit 19, when BSEL changes to "L", also changes to "L" as in the case of a fuse being not yet disconnected. As a consequence of this, as shown in FIGS. 7(a)–7(c), after BSEL has changed to "L", the inverter $21_N$ in the first column line switchover circuit 20 is supplied with the "H" level signal, and the inverters 21 excluding the inverters $21_N$ and the inverters 31 within the second column line switchover circuit 30 are all supplied with "L" level signals.

More specifically, MOSes and the inverters with suffixes of 1 to N−1 respectively operate in the same manner as when fuses are not yet disconnected, and, as a result of this, the column selection switches SW to the column lines $CL_1$–$CL_{N-1}$ are supplied with inverted signals of the signals transmitted from the NAND gates $11_1$–$11_{N-1}$.

On the other hand, when BSEL becomes "L", NMOS $23_N$ and NMOS $24_N$ relative to the inverter $21_N$ respectively take the OFF-and ON-statuses reversely to the not-yet-disconnected case of the fuses. Further, PMOS $26_N$ and PMOS $25_{N+1}$ also respectively take the OFF- and ON-statuses reversely to the not-yet-disconnected case of the fuses. As a result, the signal from the NAND gate $11_N$ is transmitted to the NMOS $24_N$ in the first column line switchover circuit 20 and supplied to the connecting portion between the sources of NMOS $33_{N+1}$ and NMOS $34_{N+1}$ within the second column line switchover circuit 30. Then, MOSes in the second column line switchover circuit 30 are controlled in the same status as the not-yet-disconnected case of the fuses, and hence the signals supplied to the connecting portion between the sources of NMOS $33_{N+1}$ and NMOS $34_{N+1}$ are fed to the inverter $42_{N+1}$ via NMOS $33_{N+1}$. That is, when disconnecting the fuse $16_N$, the signal from the NAND circuit $11_N$ is, as indicated by a bold line in FIG. 6, supplied to the inverter $42_{N+1}$ connected to the column selection switch SW for the redundant column line $RCL_1$.

Further, since PMOS $26_N$ is brought into the ON-status by the signal from the inverter $21_N$, a signal not from the NAND gate $11_N$ but from the source of PMOS $26_N$ is inputted to the connecting portion between the sources of NMOS $33_N$ and NMOS $34_N$ within the second column line switchover circuit 30. Then, NMOS $33_N$ is controlled in the ON-status by the signal from the inverter $31_N$, and hence the signal supplied to the connecting portion between the sources of NMOS $33_N$ and NMOS $34_N$ is inputted to the inverter $42_N$ via NMOS $33_N$. That is, the column selection switch $SW_N$ connected to the column line $CL_N$ is always supplied with a "L" level signal. Subsequently, conditions about PMOS $35_{N+2}$ and PMOS $36_{N+2}$ within the second column line switchover circuit 30 remain unchanged as they are when a fuse is not yet disconnected. Therefore, the column switchover switch $SW_{N+2}$ to the redundant column line $RCL_2$ is also supplied with an "L" level signal at all times.

Thus, in the case of only the fuse $16_N$ being disconnected, the signal path is switched over so that the signal from the NAND gate $11_N$ is supplied not to the inverter $42_N$ but to the inverter $42_{N+1}$, and further the inverter $42_N$ is always supplied with an "L" level signal. Therefore, as shown in FIG. 7(d), AY' (ALL "1") with a given content is inputted, and the output of the NAND gate $11_N$ becomes "L". In this case, as shown in FIGS. 7(e) and 7(f), only the inverter $42_{N+1}$ outputs an "H" level signal, and, as a result, the memory cell connected not to the column line $CL_N$ that does not normally function but to the redundant column line $RCL_1$ that normally functions (is sure to normally function), is connected to the I/O line.

Incidentally, though a specific explanation of a case where a fuse other than the fuse $16_N$ is disconnected is omitted, as will be obvious from the description given above, when a fuse $16_p$ (P≠N) is disconnected, the signals from the NAND gates $11_1-11_p$ are supplied respectively to the column selection switches $SW_1-SW_{p-1}$ for the column lines $CL_1-CL_{p-1}$, and the signals from the NAND gates $11_p-11_N$ are supplied respectively to the column selection switches $SW_{p+1}-SW_{N+1}$ for the column lines $CL_{p+1}-CL_N$ and the redundant column line $RCL_1$. Then, the column selection switches $SW_p$ to the column line $CL_p$ and the redundant column line $RCL_2$ are supplied with signals for controlling the switches in the off-status.

Figure 8:
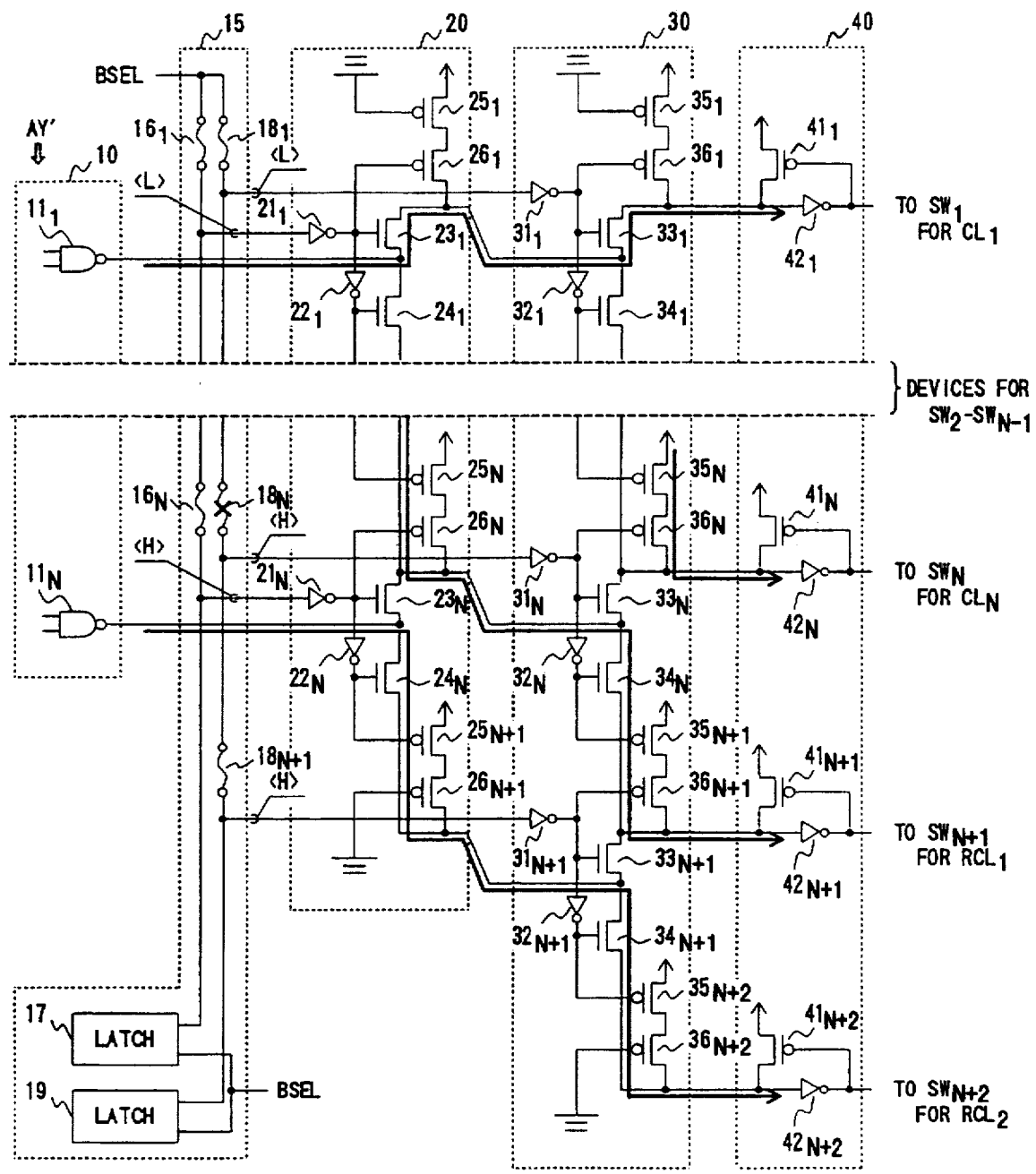
FIG. 8 is a circuit diagram of assistance in explaining the operation of the redundant circuit when two fuses are disconnected.

Further, when detecting two column lines that do not normally function as a result of performing an operation check, the semiconductor memory is used after the two fuses corresponding to these column lines have been disconnected. If the abnormality is recognized in, e.g., the column lines $CL_{N-1}$ and $CL_N$, as schematically shown in FIG. 8, there are disconnected a fuse $16_{N-1}$ (unillustrated) corresponding to the column line $CL_{N-1}$ and a fuse $18_N$ corresponding to the column line $CL_N$.

Figure 9:
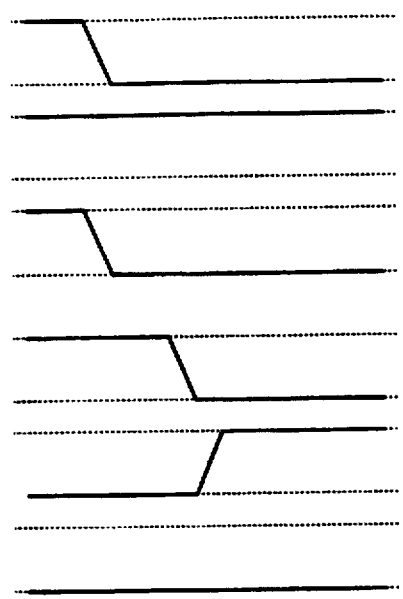
FIGS. 9(a)–9(f) form a timing chart of assistance in explaining the operation of the redundant circuit when the two fuses are disconnected.

In the state where the fuse $16_{N-1}$ and the fuse $18_N$ are disconnected, both of the latch circuits 17 and 19, as a result of being supplied with BSEL that changes from "H" to "L", do not output the "L" level signals even when BSEL comes to assume the "L" level. That is, as shown in FIGS. 9(a) and 9(b), when BSEL becomes "L", the "H" level signals are supplied to the inverters $21_{N-1}$, $21_N$ in the first column line switchover circuit 20 and to the inverters $31_N$, $31_{N+1}$ in the second column line switchover circuit 30. Further, as illustrated in FIG. 9(c), the inverters 21 and 31 exclusive of the above inverters are supplied with "L" level signals in accordance with the changes of BSEL.

Accordingly, the column selection switches for the column lines $CL_1-CL_{N-2}$ are, as in the not-yet-disconnected case of the fuses, respectively supplied with inverted signals of the signals transmitted from the NAND gates $11_1-11_{N-2}$.

Further, MOSes relative to the inverter $21_{N-1}$ and $21_N$ are controlled in the same way as they were when disconnecting only the fuse $16_N$ in the first column switchover circuit 20. Therefore, a module consisting of PMOS $25_{N-1}$ and PMOS $26_{N-1}$ supplies an "H" level signal to the sources of NMOS $33_{N-1}$ and NMOS $34_{N-1}$ in the second column line switchover circuit 30. Then, PMOS $33_{N-1}$ and PMOS $34_{N-1}$ are respectively controlled in the ON- and OFF statuses by the signal from the inverter $31_{N-1}$, and hence an "H" level signal from the drain of PMOS $26_{N-1}$ is supplied to the inverter $42_{N-1}$ for the column line $CL_{N-1}$ via NMOS $33_{N-1}$. That is, the switch for the column line $CL_{N-1}$ is always supplied with an "L" level signal without depending upon the output of the Y-address decoder 10.

Moreover, NMOS $36_N$ comes into the ON-status by the "L" level signal from the inverter $31_N$, and NMOS $35_N$ also comes into the ON-status by an "L" level signal (the inverted signal of the output of the inverter $31_{N-1}$) from the inverter $32_{N-1}$. Hence, the inverter $42_N$ for the column line $CL_N$ is always supplied with the "L" level signal.

Further, the signal from the NAND gate $11_{N-1}$ is supplied to the connecting portion between the sources of NMOS $33_N$ and NMOS $34_N$ in the second column line switchover circuit 30 via NMOS $24_{N-1}$. Subsequently, since the inverter $31_N$ in the second column line switchover circuit 30 outputs an "H" level signal, NMOS $33_N$ and NMOS $34_N$ respectively take the OFF- and ON-statuses. Therefore, the signal supplied to the connecting portion between the sources of NMOS $33_N$ and NMOS $34_N$ is transferred toward NMOS $34_N$ and supplied to the inverter $42_{N+1}$ in the column driver 40.

The "H" level signal is, as in the case of the inverter $21_{N-1}$, inputted also to the inverter $21_N$ in the first column line switchover circuit 20, and hence the signal from the NAND gate $11_N$ is supplied to the connecting portion between the sources of NMOS $33_{N+1}$ and NMOS $34_{N+1}$ in the second column line switchover circuit 30. Subsequently, the thus supplied signal is transferred toward NMOS $34_{N+1}$ controlled in the ON-status by the output of the inverter $32_{N+1}$ and supplied to the inverter $42_{N+2}$ in the column driver 40.

Thus if the fuse $16_{N-1}$ and the fuse $18_N$ are disconnected, the signal path is switched over so that the signals from the NAND gates $11_{N-1}$, $11_N$ are supplied respectively to the inverters $42_{N+1}$, $42_N$. Then, the inverters $42_{N-1}$, $42_N$ are always supplied not with the signals from the NAND gate 11 but with "H" level signals.

Hence, as shown in FIGS. 9(d) and 9(e), AY' (ALL "1") with a given content is inputted, and only the output of the NAND gate $11_N$ becomes "L". In this case, as shown in FIG. 9(f), only the inverter $42_{N+2}$ outputs an "H" level signal, and, as a result, the memory cells connected not to the column line $CL_N$ that does not normally function but to the redundant column line $RCL_2$ that normally functions (is sure to normally function), are connected to the I/O line.

So far, there has been explained the operation of the redundant circuit in the case where two consecutive column lines should be saved. The column lines that can be saved by the present redundant circuit are not, however, limited to those that are consecutive. For instance, if the column lines $CL_{N-2}$ and $CL_N$ should be saved, the semiconductor memory may be used after disconnecting the fuses $16_{N-2}$ and $18_N$ in the redundant circuit.

Figure 10:
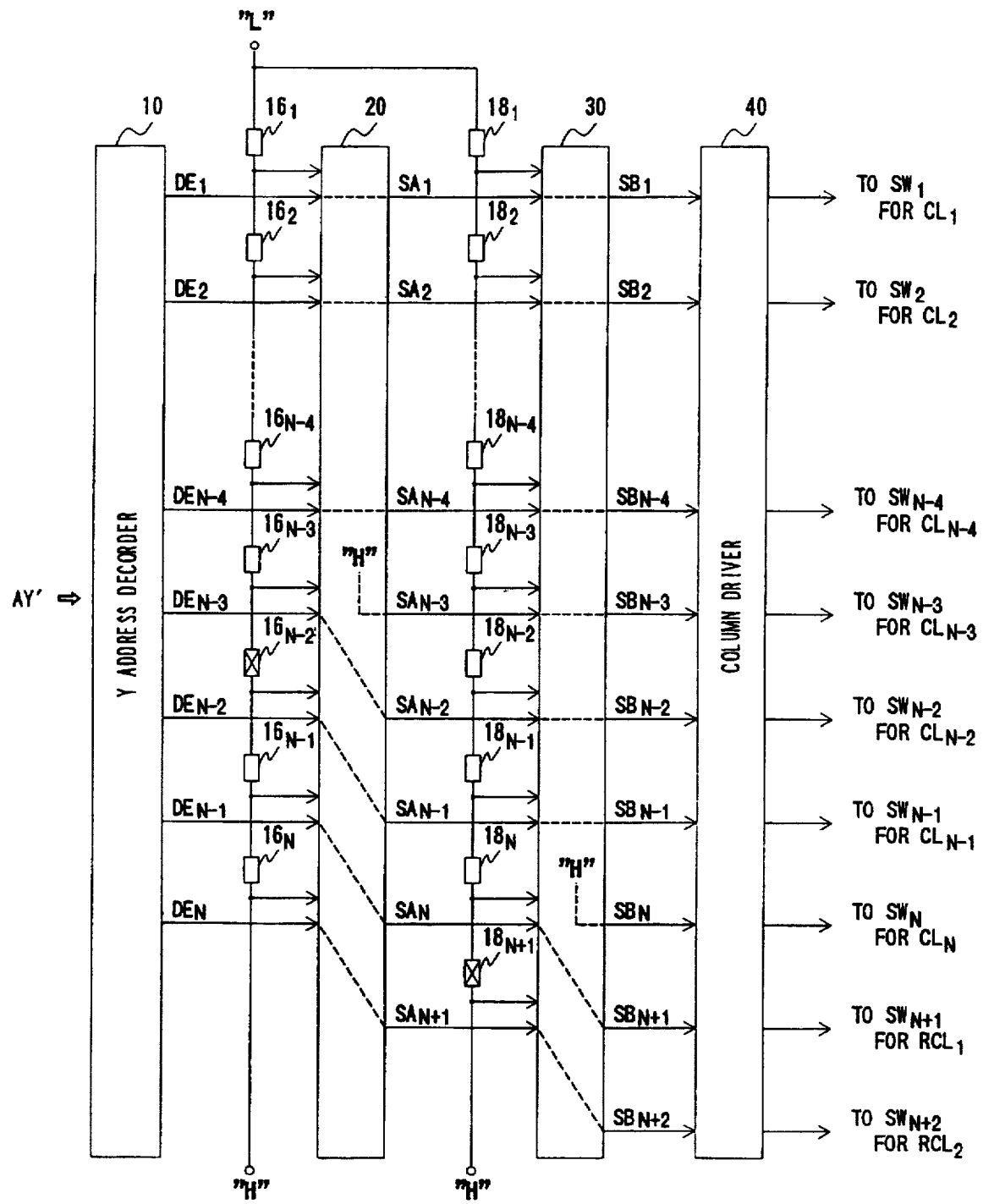
FIG. 10 is a block diagram of assistance in explaining the operation of the redundant circuit when the two fuses, relative to two column lines that are not adjacent to each other, are disconnected.

When disconnecting these fuses, as schematically shown in FIG. 10, the first column line switchover circuit 20 outputs first through (N−3)th signals $DE_1$–$DE_{N-3}$ inputted from the Y-address decoder 10 respectively as first through (N−3)th signals $SA_1$–$SA_{N-2}$. Further, the first column line switchover circuit 20 outputs (N−2)th through Nth signals $DE_{N-2}$–$DE_N$ inputted from the Y-address decoder 10 respectively as (N−1)th through (N+1)th signals $SA_{N-1}$–$SA_{N+1}$, and outputs an "H" level signal as an (N−2)th signal $SA_{N-3}$. Further, the second column line switchover circuit 30 outputs the Nth and (N+1)th signals $SA_N$, $SA_{N+1}$ respectively as (N+1)th and (N+2)th signals $SB_{N+1}$, $SB_{N+2}$, and outputs an "H" level signal as an Nth signal $SB_N$.

Then, the column driver 40 supplies inverted signals of the signals $SB_1$–$SB_{N+2}$ from the second column line switchover circuit 30 to the column selection switches SW for the column lines $CL_1$–$CL_N$ and the redundant column lines $RCL_1$, $RCL_2$.

Thus, the inverted signals of the signals $DE_1$–$DE_{N-3}$, $DE_{N-2}$, $DE_{N-1}$ and $DE_N$ are supplied respectively to the column selection switches to the column lines $CL_1$–$CL_{N-3}$, $CL_{N-1}$, and the redundant column lines $RCL_1$, $RCL_2$. The column lines $CL_{N-2}$, $CL_N$ that do not normally function are eliminated by disconnecting the fuses $16_{N-1}$, $18_N$.

Second Embodiment

Figure 11:
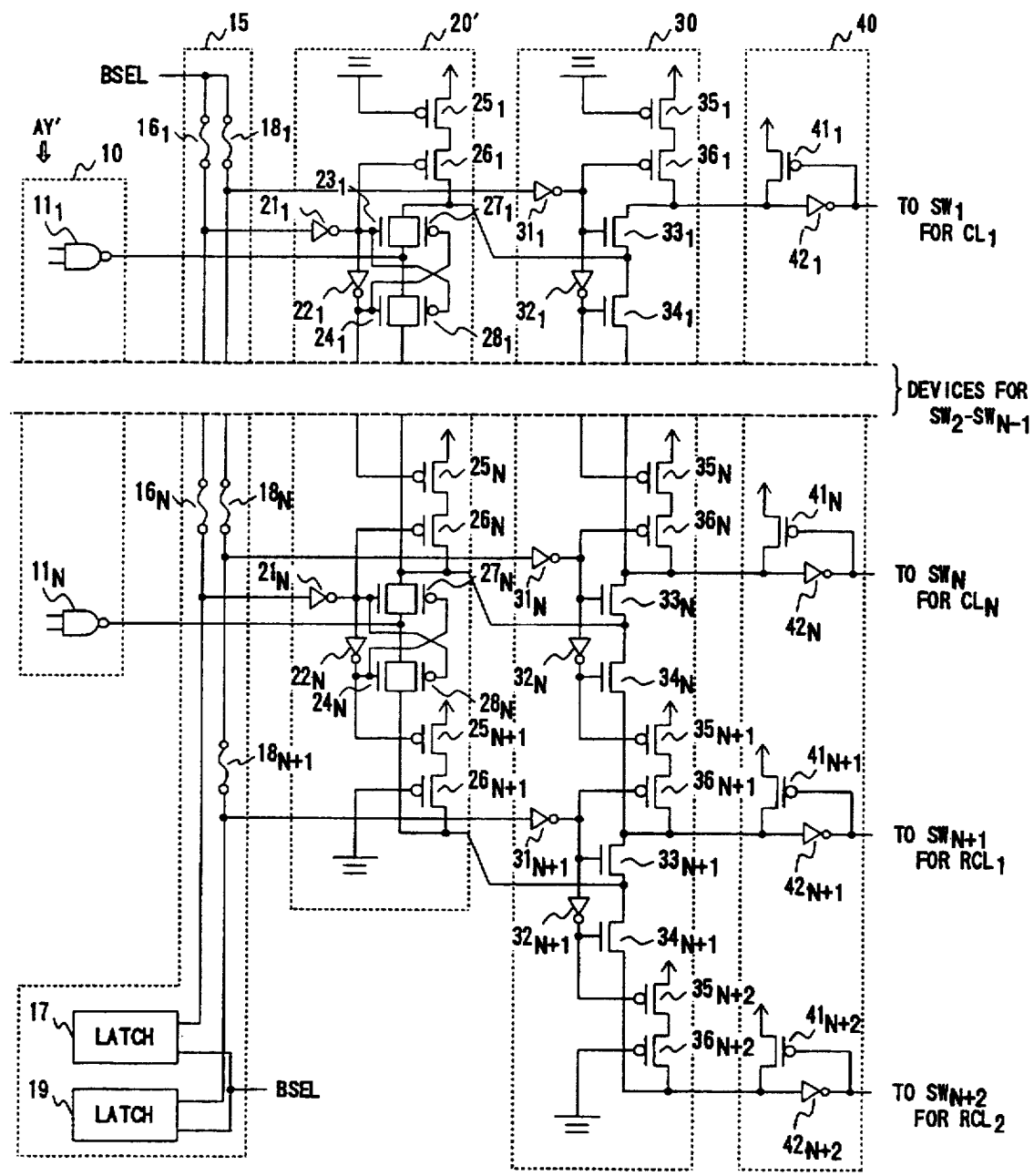
FIG. 11 is a circuit showing the redundant circuit provided in the semiconductor memory in a second embodiment.

FIG. 11 illustrates the configuration of a redundant circuit for a semiconductor memory in the second embodiment.

As depicted in the Figure, the redundant circuit has a first column line switchover circuit 20' constructed by adding PMOSes $27_K$ and $28_K$ (K=1 to N) to the first column line switchover circuit 20. The sources and drains of PMOS $27_K$ and PMOS $28_K$ (K=1 to N) are connected to the sources and the drains of PMOS $23_K$ and PMOS $24_K$, respectively. The gate of PMOS $28_K$ is connected to the output terminal of the inverter $21_K$ and the gate of PMOS $27_K$ is connected to the output terminal of the inverter $22_K$.

That is, the redundant circuit is so constructed as to feed a signal from NAND gate $11_K$ to the second column line switchover circuit 30 via NMOS $23_K$ and PMOS $27_K$ when a "L" level signal is fed to the inverter $21_K$. Moreover, the redundant circuit is so constructed as to feed a signal from NAND gate $11_K$ to the second column line switchover circuit 30 via NMOS $24_K$ and PMOS $28_K$ when an "H" level signal is fed to the inverter $21_K$.

Since the first column line circuit 20' in this redundant circuit thus feeds signals from NAND gates 11 to the second column line switchover circuit 30 via two MOSes, a signal of power supply level ($V_{CC}$) is fed to the sources of NMOS 33 and NMOS 34 in the second column switchover circuit 30. Consequently, the semiconductor memory in the second embodiment functions at higher speeds in comparison with the semiconductor memory of the first embodiment in which a signal from NAND gate 11 is fed to the second column line switchover circuit 30 via one MOS, that is, the level of the signal fed to the second column line circuit is limited to "$V_{CC}$−$V_T$" ($V_T$ being the threshold voltage of NMOSes). Besides, the semiconductor memory is capable of functioning stably with low $V_{CC}$.

Third Embodiment

Figure 12:
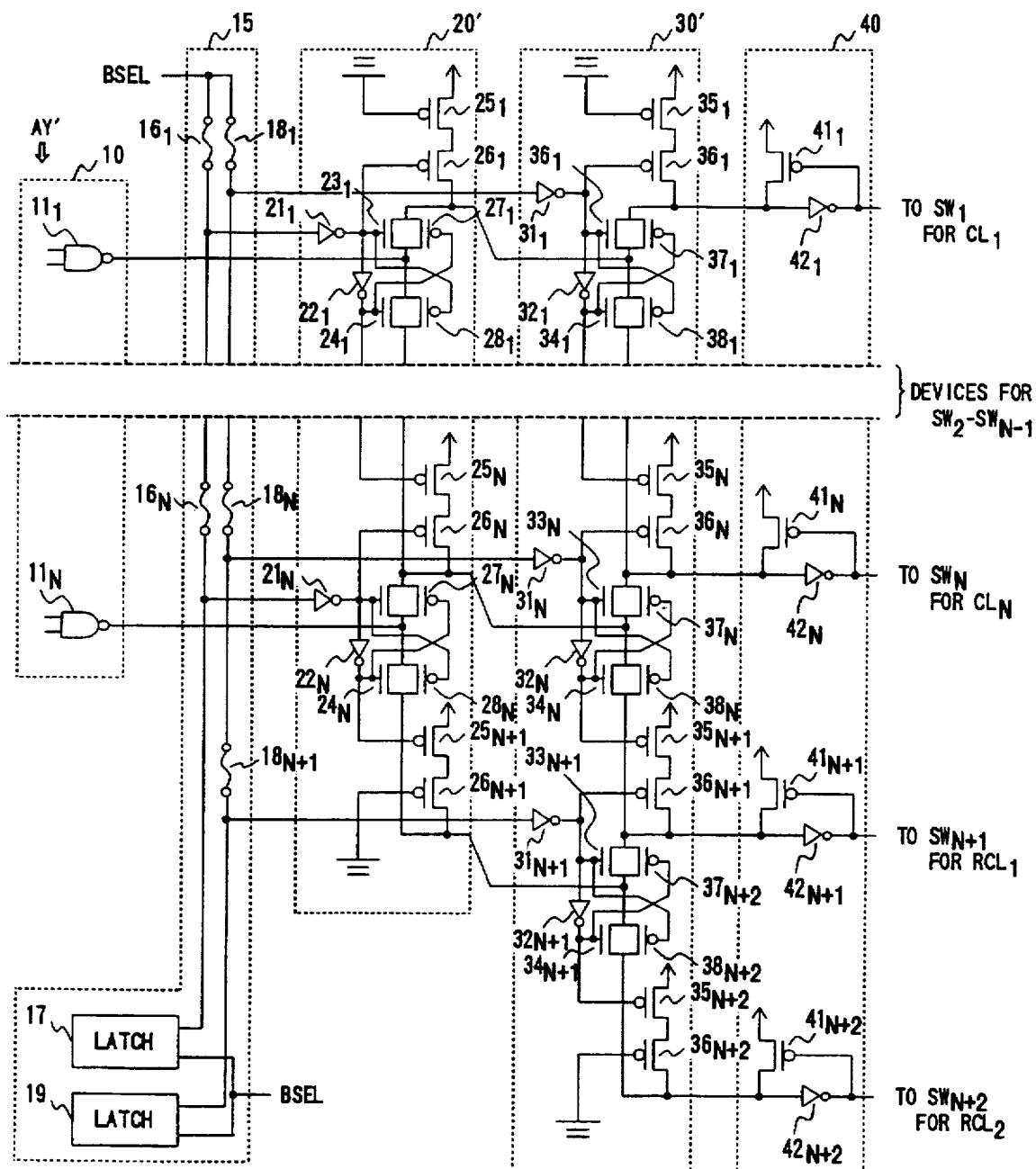
FIG. 12 is a circuit diagram illustrating the redundant circuit provided in the semiconductor memory in a third embodiment.
Figure 13:
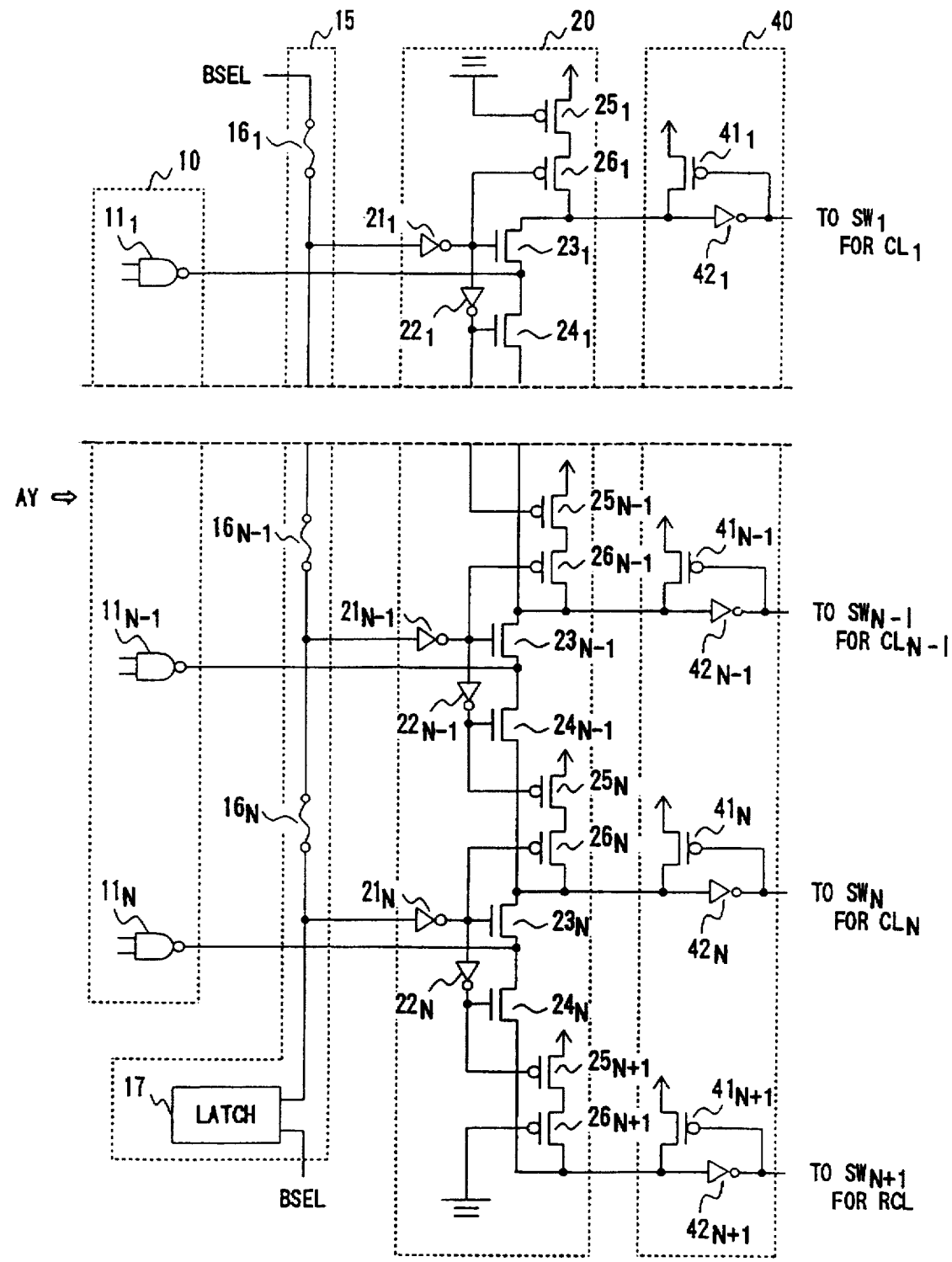
FIG. 13 is a circuit diagram illustrating a shift redundant circuit provided in a prior art semiconductor memory.

FIG. 12 illustrates the configuration of the redundant circuit provided for a semiconductor memory in the third embodiment.

As depicted in the Figure, the redundant circuit has a second column line switchover circuit 30' constructed by adding PMOSes $37_K$ and $38_K$ (K=1 to N+1) to the second column line switchover circuit 30. The sources and drains of PMOS $37_K$ and PMOS $38_K$ are connected to the sources and the drains of PMOS $33_K$ and PMOS $34_K$, respectively. The gate of PMOS $38_K$ is connected to the output terminal of the inverter $31_K$ and the gate of PMOS $37_K$ is connected to the output terminal of the inverter $32_K$.

That is, the redundant circuit is so constructed as to feed a signal from the first column line switchover circuit 20' to column driver 40 via NMOS $33_K$ and PMOS $37_K$ when an "L" level signal is fed to the inverter $31_K$. Moreover, the redundant circuit is so constructed as to feed a signal from the first column line switchover circuit 20' to the column driver 40 via NMOS $24_K$ and PMOS $28_K$ when an "H" level signal is fed to the inverter $31_K$.

Since the second column line circuit 30' in this redundant circuit thus feeds signals from the first column line circuit 20' to the column driver 40 via two MOSes, signals of power supply level ($V_{CC}$) are fed to the inverters 42. Therefore, the semiconductor memory in this embodiment functions at higher speeds in comparison with the semiconductor memory of the second embodiment.

It is apparent that, in this invention, a wide range of different working modes can be formed based on the invention without deviating from the spirit and scope of the invention. This invention is not restricted by its specific working modes except being limited by the appended claims.

What is claimed is:

1. A semiconductor memory, comprising:
 an address decoder for outputting first through Nth control signals, one of which assumes a first potential level and the rest of which assume a second potential level, on the basis of inputted address signals;
 a primary selection signal outputting circuit, capable of setting a value of P, for outputting first through Pth primary selection signals with the first potential level, and outputting (P+1)th through Nth primary selection signals with the second potential level;
 a secondary selection signal outputting circuit, capable of setting a value of Q, for outputting first through Qth secondary selection signals with the first potential level, and outputting (Q+1)th through (N+1)th secondary selection signals with the second potential level;
 a primary switchover circuit, having first through (N+1)th primary control signal output nodes and first through Nth primary control signal input nodes to which the first through Nth control signals are inputted from said address decoder, for electrically connecting the first through Pth primary control signal input nodes respectively to the first through Pth primary control signal output nodes, and electrically connecting the (P+1)th through Nth primary control signal input nodes respectively to the (P+2)th through (N+1)th primary control signal output nodes, and for outputting a signal with the second potential level on the (P+1)th primary control signal output node in accordance with the first through Nth primary selection signals given from said primary selection signal outputting circuit;
 a secondary switchover circuit, having first through (N+2)th secondary control signal output nodes and first through (N+1)th secondary control signal input nodes connected to the first through (N+1)th primary control signal output nodes of said primary switchover circuit, for electrically connecting the first through Qth secondary control signal input nodes respectively to the first through Qth secondary control signal output nodes, and electrically connecting the (Q+1)th through (N+1) th secondary control signal input nodes respectively to the (Q+2)th through (N+2)th secondary control signal output nodes, and for outputting a signal with the second potential level on the (Q+1)th secondary control signal output node in accordance with the first through (N+1)th secondary selection signals given from said secondary selection signal outputting circuit; and (N+2) memory cell groups which respectively turn ON when a signal with the first potential level is fed from said first through (N+2)th secondary control signal output nodes.

2. A semiconductor memory according to claim 1, wherein said primary switchover circuit includes:
first through Nth normality NMOSes for electrically connecting the first through Nth primary control signal input nodes to the first through Nth primary control signal output nodes when the first through Nth primary selection signals with the first signal level are fed thereto respectively; and first through Nth redundancy NMOSes for electrically connecting the first through Nth primary control signal input nodes to the second through (N+1)th primary control signal output nodes when the first through the Nth primary selection signals with the second signal level are fed thereto respectively, and wherein said secondary switchover circuit includes:
first through (N+1)th normality NMOSes for electrically connecting the first through (N+1)th secondary control signal input nodes to the first through (N+1)th secondary control signal output nodes when the first through the (N+1)th secondary selection signals with the second signal level are fed thereto respectively; and first through (N+1)th redundancy NMOSes for electrically connecting the first through (N+1)th primary control signal input nodes to the second through (N+2)th primary control signal output nodes when the first through the (N+1)th primary selection signals with the second signal level are fed thereto respectively.

3. A semiconductor memory according to claim 2, wherein said primary selection signal outputting circuit includes:
a primary fuse circuit, constructed of first through Nth primary fuses connected in series, to which a selection signal generating signal the level of which changes in terms of time is inputted from the side of said first primary fuse; and a primary latch circuit, connected to said Nth primary fuse of said primary fuse circuit, to which the selection signal generating signal is inputted, for outputting a signal with the second potential level to said Nth primary fuse when one of said first through Nth primary fuses is disconnected, and outputting a signal with the same level as the selection signal generating signal to said Nth primary fuse when said first through Nth primary fuses are not yet disconnected, said first through Nth primary selection signals being provided at terminals of said first through Nth primary fuses, and wherein said secondary selection signal outputting circuit includes:
a secondary fuse circuit, constructed of first through (N+1)th secondary fuses connected in series, to which the selection signal generating signal is inputted from the side of said first primary fuse; and a secondary latch circuit, connected to said (N+1)th secondary fuse of said secondary fuse circuit, to which the selection signal generating signal is inputted, for outputting a signal with the second potential level to said (N+1)th secondary fuse when one of said first through (N+1)th secondary fuses is disconnected, and outputting a signal with the same level as the selection signal generating signal to said (N+1)th primary fuse when said first through (N+1)th primary fuses are not yet disconnected, said first through (N+1)th secondary selection signals being provided at terminals of said first through (N+1)th secondary fuses.

4. A semiconductor memory according to claim 2, wherein said primary switchover circuit further includes:
first through Nth normality PMOSes, having drains and gates that are connected to drains and sources of said first through Nth normality NMOSes, and brought into ON-status when first through Nth primary selection signals with the first potential level are fed thereto respectively; and first through Nth redundancy PMOSes, having drains and gates that are connected to drains and sources of said first through Nth redundancy NMOSes, and brought into ON-status when first through Nth primary selection signals with the second potential level are fed thereto respectively.

5. A semiconductor memory according to claim 4, wherein said secondary switchover circuit further includes:
first through (N+1)th normality PMOSes, having drains and gates that are connected to drains and sources of said first through (N+1)th normality NMOSes, and brought into ON-status when first through (N+1)th primary selection signals with the first potential level are fed thereto respectively; and first through (N+1)th redundancy PMOSes, having drains and gates that are connected to drains and sources of said first through (N+1)th redundancy NMOSes, and brought into ON-status when first through (N+1)th primary selection signals with the second potential level are fed thereto respectively.

6. A semiconductor memory, comprising:

an address decoder having N decoder output gates;

a selection circuit having a primary portion to generate primary selection signals and a secondary portion to generate secondary selection signals;

primary switchover means, having N input nodes that are coupled to the N decoder output gates and having N+1 output nodes, for passing signals from the decoder output gates to all but one of the output nodes in a signal-passing pattern that is determined by the primary selection signals;

secondary switchover means, having N+1 input nodes that are coupled to the N+1 output nodes of the primary switchover means and having N+2 output nodes, for passing signals received from the decoder output gates via the primary switchover means to all but two of the output nodes of the secondary switchover means in a signal-passing pattern that is determined by the secondary selection signals;

a plurality of memory cell groups; and means for coupling the output nodes of the secondary switchover means to the memory cell groups, wherein the primary portion of the selection circuit comprises a first series of fuses and the secondary portion of the selection circuit comprises a second series of fuses, and wherein said semiconductor memory further comprises a plurality of first inverters connecting the first series of fuses to the primary switchover means, and a plurality of second inverters connecting the second series of fuses to the secondary switchover means.

7. A semiconductor memory according to claim 6, wherein said plurality of memory cell groups has N+2 memory cell groups, each memory cell group being coupled to one of the output nodes of the secondary switchover means.

8. A semiconductor memory according to claim 6, wherein said first series of fuses has N fuses and said second series of fuses has N+1 fuses.

* * * * *